US006666920B1

(12) United States Patent
Sillmon et al.

(10) Patent No.: US 6,666,920 B1
(45) **Date of Patent: *Dec. 23, 2003**

(54) GAS COLLECTOR FOR PROVIDING AN EVEN FLOW OF GASSES THROUGH A REACTION CHAMBER OF AN EPITAXIAL REACTOR

(75) Inventors: Roger Sillmon, Troutville, VA (US); Khang V. Nguyen, Salem, VA (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 211 days.

This patent is subject to a terminal disclaimer.

(21) Appl. No.: 09/993,614

(22) Filed: Nov. 27, 2001

Related U.S. Application Data

(63) Continuation-in-part of application No. 09/884,944, filed on Jun. 21, 2001, which is a continuation-in-part of application No. 09/635,268, filed on Aug. 9, 2000, now Pat. No. 6,325,855.

(51) Int. Cl.[7] .................... C23C 16/00
(52) U.S. Cl. .................... 118/715; 118/733; 156/345.29
(58) Field of Search .................... 118/715, 733; 156/345.29

(56) References Cited

U.S. PATENT DOCUMENTS

| | | | | |
|---|---|---|---|---|
| 4,961,399 A | * | 10/1990 | Frijlink | 118/730 |
| 4,976,217 A | | 12/1990 | Frijlink | |
| 5,441,568 A | * | 8/1995 | Cho et al. | 118/715 |
| 5,558,717 A | * | 9/1996 | Zhao et al. | 118/715 |
| 5,582,866 A | | 12/1996 | White | |
| 5,846,330 A | | 12/1998 | Quirk et al. | |
| 5,885,356 A | * | 3/1999 | Zhao et al. | 118/723 ER |
| 5,895,530 A | * | 4/1999 | Shrotriya et al. | 118/715 |
| 6,325,855 B1 | * | 12/2001 | Sillmon et al. | 118/715 |
| 6,423,949 B1 | * | 7/2002 | Chen et al. | 219/444.1 |
| 6,478,877 B1 | * | 11/2002 | Sillmon et al. | 118/733 |
| 6,530,992 B1 | * | 3/2003 | Yang et al. | 118/695 |
| 6,582,522 B2 | * | 6/2003 | Luo et al. | 118/715 |
| 2002/0017244 A1 | * | 2/2002 | Sillmon et al. | 118/715 |

FOREIGN PATENT DOCUMENTS

| | | |
|---|---|---|
| GB | 1 215 140 A | 12/1970 |
| WO | WO 00/04205 | 1/2000 |

OTHER PUBLICATIONS

"Layer uniformity in a multiwafer MOVPE reactor for III–V compounds" P.M. Frijlink et al., *Journal of Crystal Growth*, North–Holland Publishing Co., Amsterdam, NL, vol. 107, No. 1 / 4, 1991, pp. 166–174, XP000246591, ISSN: 0022–0248.

* cited by examiner

*Primary Examiner*—Jeffrie R. Lund
(74) *Attorney, Agent, or Firm*—McDermott, Will & Emery

(57) ABSTRACT

A gas collector for collecting gasses from within a reaction chamber of a reactor comprises a body having a conduit, at least one inlet, an outlet, and a seal disposed on the body. The seal cooperates with a lid of the reactor to prevent escape of reaction gasses from the reaction chamber. The inlets direct the gasses from the reaction chamber into the conduit, and the outlet exhausts the gasses from the conduit. The gas collector includes means for providing an even flow of gasses through the reaction chamber. The body includes a first member and a second member with the seal disposed on the second member. The body can include inter-member seals for reducing the flow of the gasses across an interface between the first member and the second member. The inter-member seals disposed between the first member and the second member and allow movement of the first member relative to the second member. The body can also be formed from graphite.

47 Claims, 10 Drawing Sheets

GAS COLLECTOR FOR PROVIDING AN EVEN FLOW OF GASSES THROUGH A REACTION CHAMBER OF AN EPITAXIAL REACTOR

CROSS REFERENCE TO RELATED APPLICATIONS

This application is a continuation-in-part of U.S. application Ser. No. 09/884,944, filed Jun. 21, 2001, now pending, which is a continuation-in-part of U.S. application Ser. No. 09/635,268 filed Aug. 9, 2000, U.S. Pat. No. 6,345,855 now pending, both incorporated herein by reference.

FIELD OF THE INVENTION

The present invention relates to epitaxial reactors and, more particularly, to a gas collector for epitaxial reactors.

BACKGROUND OF THE INVENTION

Continuing advances in the semiconductor industry have resulted in the development of highly complex thin-film deposition processes for fabricating semiconductor devices that are packaged for use in the manufacture of sophisticated electronic devices. The thin films of material that are deposited on the semiconductor wafers are often referred to as epitaxial layers. High speed electronic transistors, quantum-well diode lasers, light-emitting diodes, photodetectors, and optical modulators incorporate structures composed of numerous epitaxial layers ranging in thickness from several microns to as thin as a few tenths of a nanometer. These epitaxial layers are typically deposited, or grown, on a single-crystal substrate, i.e., the semiconductor wafer.

One method of forming epitaxial layers on a semiconductor wafer is known as chemical vapor deposition (CVD). In a typical manufacturing process of a wafer, for example, silicon or gallium arsenide in extremely pure crystalline form is overlaid sequentially with numerous layers of materials, which function as conductors, semiconductors, or insulators. Each subsequent layer is ordered and patterned such that the sequence of layers forms a complex array of electronic circuitry. The semiconductor wafer can then be subsequently cut along predetermined scribe lines into individual devices, commonly referred to as “chips.” These chips ultimately function as key components in electronic devices ranging from simple toys to complex supercomputers.

CVD processes normally take place within a reaction chamber. Initially, the semiconductor wafer is placed within a reaction chamber containing an inert atmosphere, and the temperature within the reaction chamber is elevated. Reaction gasses containing the compound or element to be deposited are then introduced to react with the surface of the semiconductor wafer, which results in deposition of the required film onto the semiconductor wafer. The reacted gasses are continually introduced and removed from the reaction chamber until a requisite film thickness has been achieved.

An example of an epitaxial reactor is described in U.S. Pat. No. 4,961,399, to Frijlink, which is incorporated herein by reference. This patent describes a reactor into which reaction gasses are introduced via a quartz funnel that is located at the center of the reactor. The reaction gasses then flow radially outward towards a quartz ring that bounds the reactor. Along the circumference of the quartz ring are equidistant slits, which collect the reacted gasses. Bounding the upper portion of the reaction chamber is a quartz disk. The quartz disk seals against O-rings, witch are positioned behind the quartz ring. Because quartz is a brittle and inflexible material, the quartz disk does not seal against the quartz ring. Instead, a gap is provided between the quartz disk and the quartz ring to prevent chipping of either.

This gap between the quartz disk and the quartz ring can cause problems within the reactor. For example, reaction gasses can escape through the gap and can form deposits outside the reaction chamber, and these deposits can interfere with the working of the reaction chamber and can also flake off and act as contaminants. Although a narrower gap can be provided, if a hard foreign body wider than the gap is introduced into the gap, such as during the opening of the reaction chamber, the foreign body could prevent the quartz disk from sealing properly over the reaction chamber or can cause chipping of either the quartz disk or the quartz ring.

An attempted solution to the above-described problems is disclosed in U.S. Pat. No. 4,976,217 to Frijlink, which is incorporated herein by reference. This patent describes a collecting crown or gas collector, which is both used to collect reaction gasses from the reaction chamber and also to provide a seal between the reaction chamber and a quartz disk or cover.

The gas collector and reaction chamber of the prior art is illustrated in FIGS. 1 and 2. The gas collector 1 is mounted on a supporting platform 4 by a horizontal plate 10 that rests upon the supporting platform 4. The supporting platform 4 is typically formed from quartz and is positioned within a cylindrical body 19 of the reactor that surrounds the reaction chamber and the gas collector 1. The cover 8 of the reaction chamber bounds the top of the reaction chamber and seals against the upper ridge 6 of the gas collector 1 and against toric joints 20 within the cylindrical body 19.

The gas collector 1 is further illustrated in FIG. 3. The gas collector 1 is formed from a folded plate of molybdenum having elastic properties. The molybdenum plate is folded along horizontal folding lines 13 and vertical folding lines 14 to form multiple flat plates 17, 5, 18, 9, 3, 10 that are connected to one another along the folding lines 13, 14. Also, two plates 2, 3 are touching without being fixed to each other. The combination of plates 17, 5, 18, 9, 3, 10 form a conduit 30 that encircles the reaction chamber. One of the plates 17 includes regularly spaced inlets holes 12 that collect the reaction gasses from the reaction chamber. Instead of the inlet hole 12, as shown below on the right-hand side of FIG. 3, the wall plate 17 can be provided with folded lower projections 15, which separate the movable lower edge 2 away from the fixed edge 3 to leave a slot between the edges 2, 3 through which the reaction gas can then pass.

The ’217 patent states that an essential element of the gas collector 1 is the vertical baffle plate, which is constituted by plates 17, 3 with the lower edge 2 of the upper plate 17 being pressed with a sliding motion against the upper edge of the lower plate 3. The horizontal plates 10 that are connected to the lower plates 3 serve to place the gas collector 1 on the edge of the platform 4. Furthermore, the top plate 5 is inclined and includes an upper ridge 6.

A problem with the gas collector 1 of the prior art is illustrated in FIG. 4. The epitaxial reactor described in U.S. Pat. No. 4,961,399 was designed under the assumption that an even distribution of gasses flows out from the middle of the reactor to the gas collector 1. The prior art assumed that by regularly placing inlet holes 12 along the front wall 17 of the gas collector 1, the flow distribution (illustrated in FIG.

4 with arrows) of the reaction gasses would also be regularly distributed. However, it has been discovered that the gas collector 1 of the prior art does note produce an even flow distribution.

The flow distribution is skewed by the placement of exhaust tubes 29 in the rear wall 18 of the gas collector 1. Gasses will follow the path of least resistance, and the path of least resistance into and through the gas collector 1 is in a direction generally towards the location of the exhaust tubes 29. In this manner, a greater volume of gas passes through the inlet holes 12 that are immediately adjacent the exhaust tubes 29 as compared to inlet holes 12 that are farther away from the exhaust tubes 29. Therefore, an even flow distribution of reaction gasses into the gas collector 1 is not present.

If the reaction gasses are not flowing evenly from the center of the reaction chamber, the deposition process varies depending upon the location of the wafers within the reaction chamber because the densities of the various constituents of the reaction gasses also vary depending upon their location within the reactor chamber. As such, the thickness and quality of the deposition can vary from one wafer to the next, even within the same batch process. For example, when depositing $Al_xGaAs$ using the gas collector 1 of the prior art, the percentage (x) of aluminum being deposited varies not only from one batch of wafers to the next, but also varies within wafers in single batch and also within a single wafer. There is, therefore, a need for a gas collector that solves the problems of the prior art by providing an even flow of reaction gasses through the gas reactor.

SUMMARY OF THE INVENTION

This and other needs are met by embodiments of the present invention which provide a gas collector for collecting gasses from within a reaction chamber of a reactor. The gas collector includes a body, in which is defined a conduit, at least one inlet, an outlet, and a seal. The seal cooperates with a removable lid of the reactor to prevent escape of the gasses from the reaction chamber. Also, the inlets direct the gasses from the reaction chamber into the conduit, and the outlet exhausts the gasses from the conduit into an exhaust pipe of the reactor. The gas collector additionally includes means for providing an even flow of gasses through the reaction chamber.

By providing a even flow of gasses through the reaction chamber, the deposition process within the reaction chamber is more consistent. A more consistent deposition process results in the thickness and the quality of the deposits not varying as much between wafers in a single batch, between wafers in different batches, and within a single wafer, as compared to the gas collector of the prior art.

In one aspect of the invention, an even flow of gasses through the reaction chamber is provided by including a baffle positioned within the conduit approximate each of the outlets. In another aspect, the even flow of gasses is provided by dividing the body into equally-sized sectors and having a total intake area of inlets in each of the sectors continually increase in a circumferential direction away from an outlet. The increasing total intake area can be provided by increasing a size of each inlet in a circumferential direction away from the outlet and/or increasing a density of inlets in each sector in a circumferential direction away from the outlet.

In other aspects of the invention, the body can be rigid. Further the body can include a first and second members separate from one another. The body can also include inter-member seals that reduce the flow of the gasses across an interface between a first member and a second member of the body. The inter-member seals are disposed between the first member and the second member and allow movement of the first member relative to the second member. Additionally, the gas collector can include a device for pressing the seal against the lid, such resilient members, which are disposed within the conduit. The body can also include graphite.

Additional advantages of the present invention will become readily apparent to those skilled in this art from the following detailed description, wherein only an exemplary embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout and wherein.

DETAILED DESCRIPTION OF THE INVENTION

The present invention addresses and solves the problem of gasses not evenly flowing through a reaction chamber of a gas collector with this problem creating inconsistent deposition conditions within the reaction chamber. This is achieved, in part, by providing a baffle that impedes the direct path of reaction gasses to an outlet in an outer wall of the gas collector. Additionally, an even flow can be obtained by increasing the area of the inlets in the gas collector in a direction away from the outlet. Still further, an even flow can be obtained by increasing the density of inlets in a direction away from the outlet. An even flow can also be obtained by reducing or eliminating alternate paths, other than the inlets, through which the reaction gasses can flow from the reaction chamber into the gas collector or from the reaction chamber past the gas collector. These various means of maintaining an even flow of reaction gasses through the reaction chamber can be used in combination or alone.

Figure 1:
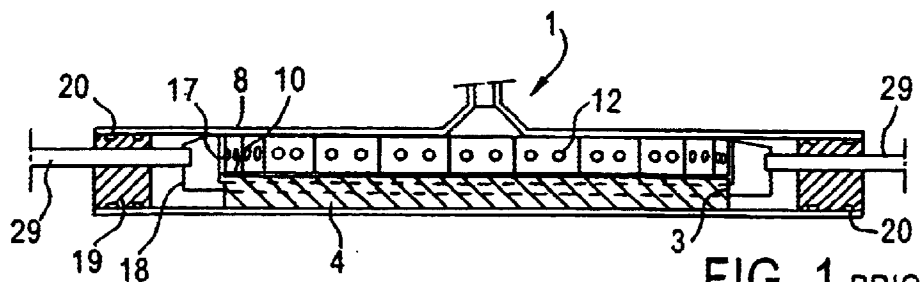
FIG. 1 is a side cross-sectional view of a gas collector and reactor in accordance with the prior art.
Figure 2:
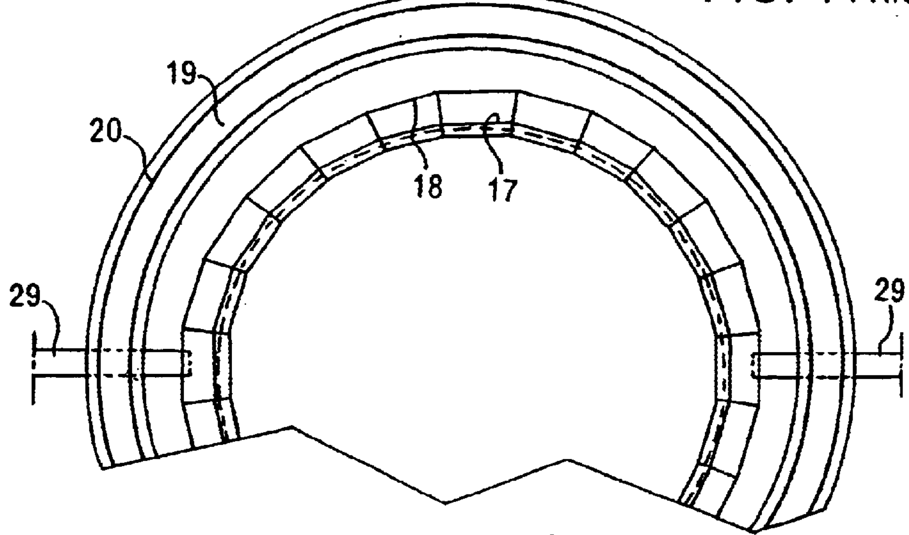
FIG. 2 is a plan view of the reactor shown in FIG. 1 with the cover removed.
Figure 3:
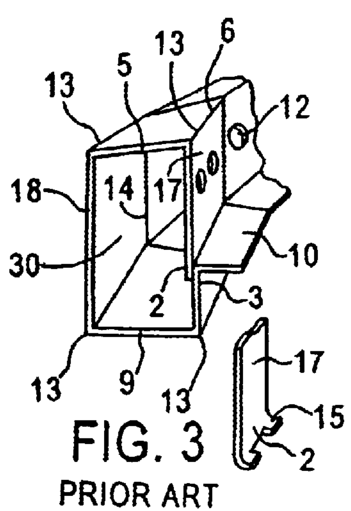
FIG. 3 is a perspective cross-sectional view of the gas collector in FIG. 1.
Figure 4:
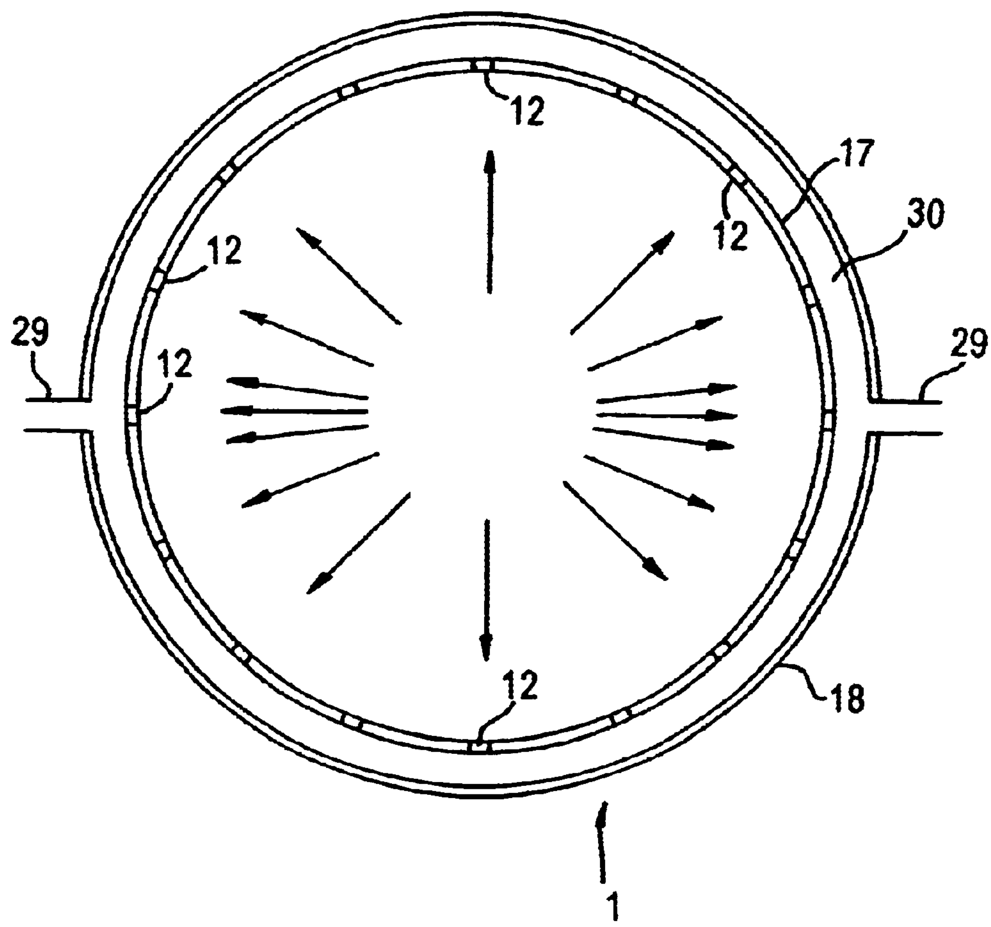
FIG. 4 is a partial plan view of the gas collector shown in FIG. 1 illustrating the flow path of reaction gasses flowing into the gas collector.
Figure 5:
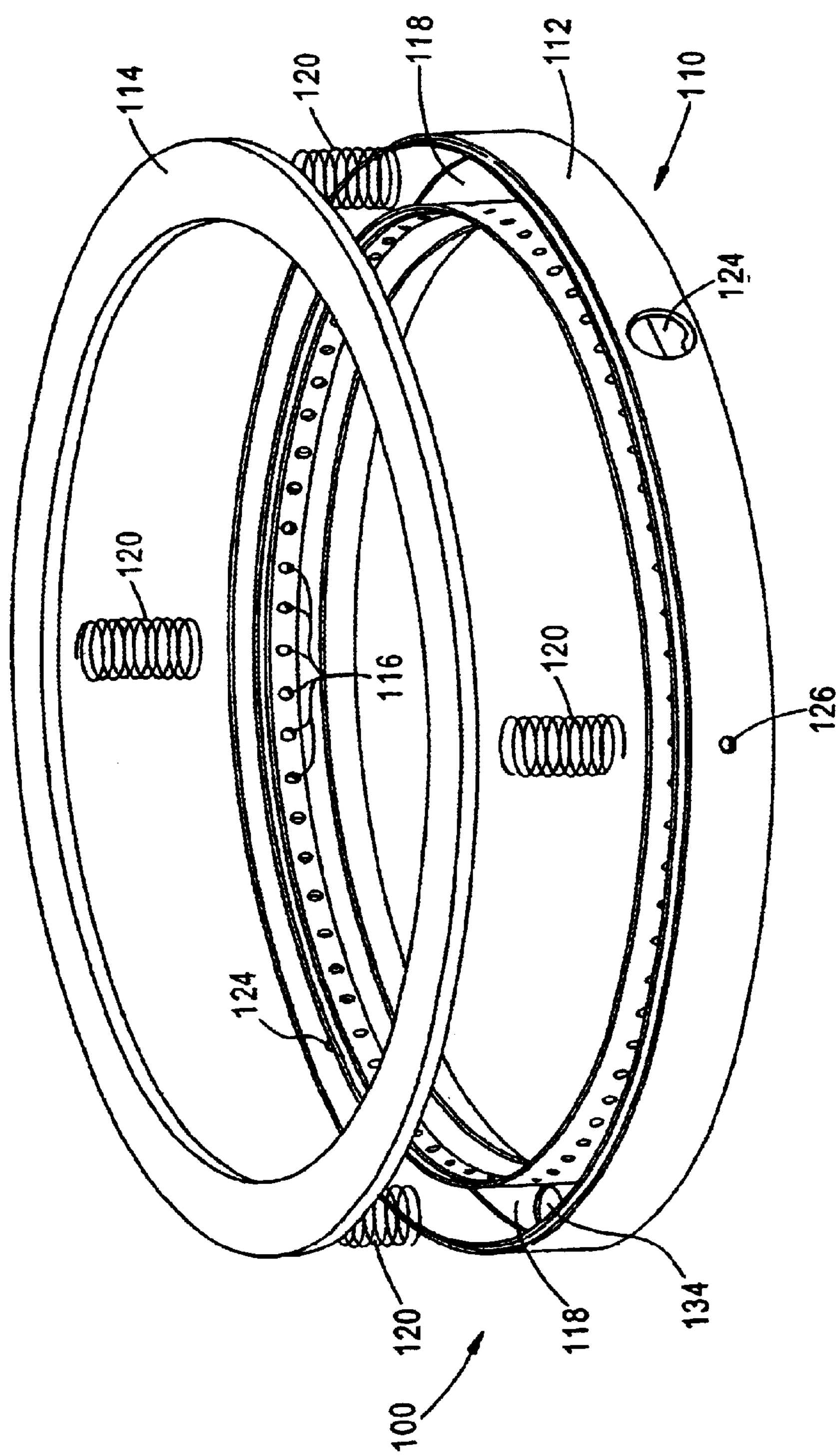
FIG. 5 is an exploded view of a gas collector constructed in accordance with the present invention.

A gas collector according to one aspect of the invention is illustrated in FIG. 5. The gas collector 100 includes a body 110 having at least one inlet 116 for receiving gasses from the reaction chamber (best shown in FIGS. 1 and 2) of the reactor. In certain aspects of the invention, the gas collector is used with a reactor, although the gas collector is not limited in its use as to a particular type of reactor. For example, the gas collector can be used with an epitaxial reactor. Examples of materials capable of being deposited with the reactor include type III–IV compound semiconductors. Illustrative examples of these are GaAs, AlGaAs and InGaAs.

In one aspect of the invention, the body 110 includes at least two members 112, 114 separate from each other. The members 112, 114 of the body 110, either individually or in combination, receive gasses from within the reaction chamber of the reactor and also cooperate with the reactor, for example the lid of the reactor, to form a seal that reduces the escape of gasses from the reaction chamber. The gas collector 100 collects chemical vapors (i.e., reaction gasses from chemical vapor deposition) into a conduit 118 from the reaction chamber of the reactor and directs the reaction gasses to the reactor's exhaust pipes (shown in FIGS. 2 and 9 with reference number 29) through outlets 124 formed in a outer wall of the body 110. Although not limited in this manner, the gas collector 100 can include at least one secondary inlet 126 formed in the outer wall of the body 110 to facilitate introduction of a purge gas into the conduit 118. Besides the inlet and outlet holes 116, 126, 124, in one aspect of the invention, the body 110 surrounds the conduit 118 and prevents escape of gasses from within the conduit 118.

The body 110 includes at least one outlet 124 through which reaction gasses in the conduit 118 can be exhausted to the exhaust pipe of the reactor. The outlets 124 can be formed in any of the members 110, 112, and the outlets 124 are not limited as to a particular shape or size nor are the outlets 124 limited as to a particular distribution pattern in the members 110, 112. In a current aspect, multiple outlets 124 are provided in the body 110 such that the outlets 124 provide an even pressure differential along the circumference of the conduit 118. In this manner, the reaction gasses flow uniformly from the reaction chamber, through the inlets 116 into the conduit 118, and from the conduit through the outlets 124 and into the exhaust pipe.

The invention is not limited as to a particular seal between the body 110 and the lid. For example, the seal can be a strip of flexible material, such as molybdenum, positioned on a top portion of the body 110. However, in a current aspect of the invention, the second member 114 cooperates with a lid (best shown in FIG. 1 with reference number 8) of the reactor to reduce the escape of reaction gasses from the reaction chamber. In operation, the lid is lowered onto the second member 114 to form a seal between the second member 114 and the lid.

The gas collector 100 receives gasses from within the reaction chamber through inlets 116 in the portion of the body 110 adjacent the reaction chamber. The inlets 116 can be formed in any of the members 110, 112, and the inlets 116 are not limited as to a particular shape or size nor are the inlets 116 limited as to a particular distribution pattern in the members 110, 112. For example, the shape of the inlets 116 can be narrow slits, oval, or as illustrated, circular. Additionally, the body 110 can have inlets 116 with different shapes and/or sizes. In a current aspect of the gas collector 100, the inlets 116 are provided on the gas collector 100 so as to create a even flow of gasses from within the reaction chamber into the gas collector 100. An even flow of gasses through the reaction chamber is obtained when the gasses in any position within the reaction chamber at a given radial distance away from the center of the reaction chamber have substantially equal pressures. In this manner, the flow of gasses through the reaction chamber are not skewed in certain directions, such as what occurs with the gas collector of the prior art.

Figure 6:
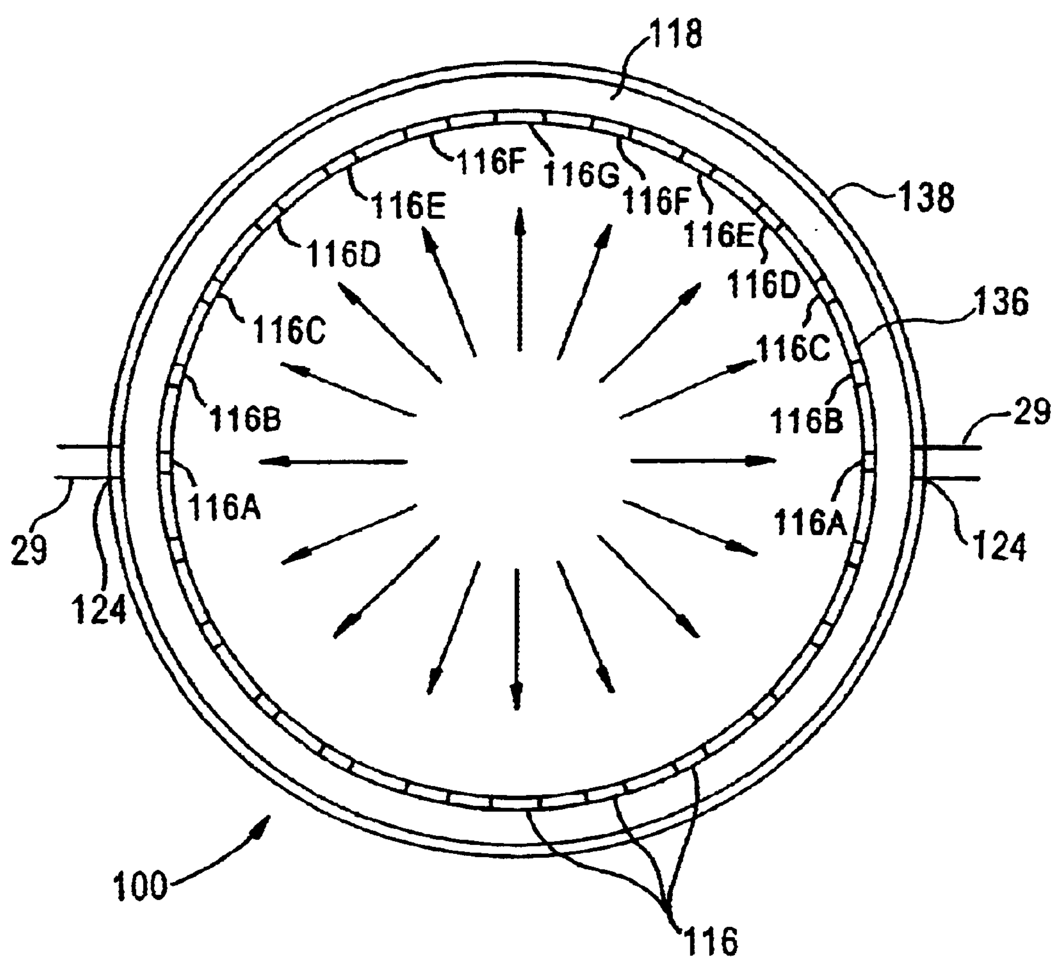
FIG. 6 is a partial plan view of the gas collector shown in FIG. 5 illustrating an even flow path of reaction gasses flowing into the gas collector.
Figure 7:
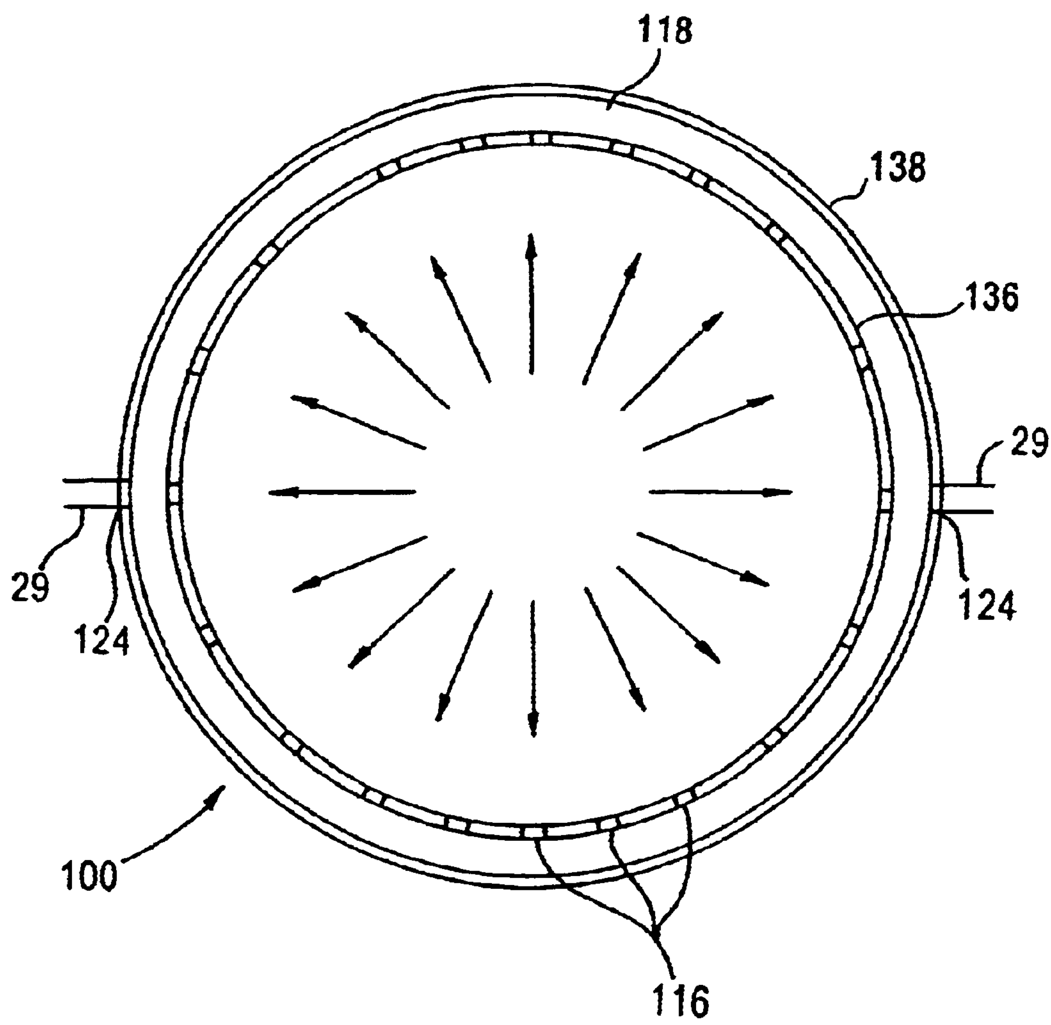
FIG. 7 is a partial plan view of the gas collector shown in FIG. 5 illustrating an even flow path of reaction gasses flowing into the gas collector.

By changing the size and/or density of the inlets 116 in a direction away from the outlet 124, the shorter path of reaction gasses to the outlet 124 for inlets 116 adjacent the outlet 124 can be offset by providing for a higher resistance through those inlets 116 closer to the outlet 124. In this manner, an even flow of reaction gasses pass from the center of the reaction chamber to the gas collector 100. In one aspect of the invention, as illustrated in FIGS. 6 and 7, an even flow of reaction gasses through the reaction chamber is obtained by increasing the effective intake area of the inlets 116 in a direction along the inner wall 136 of the gas collector 100 away from the outlet 124. Thus, by dividing the inner wall 136 of the gas collector 100 into equal-sized sectors, wherein a sector is defined as including at least one inlet 116, the total intake area of the inlets 116 in a particular sector increases in a circumferential direction away from an outlet 124. The total intake area is defined as the combined surface area of the openings defined by each inlet 116 in a particular sector.

As illustrated in FIG. 6, the effective intake area is increased by increasing the area of regularly spaced inlets 116 in a direction away from the outlet 124. Thus, the size of an inlet 116G farthest away from an outlet 124 is larger than the size of an inlet 116A immediately adjacent an outlet 124. Alternatively, as illustrated in FIG. 7, the effective intake is increased by increasing the number of same-area inlets 116 in a direction away from the outlet 124. As such, although each inlet 116 has the same area, the number of inlets 116 in a particular sector increases in a direction away from the outlet 124.

Alternatively, a combination of different-size inlets 116 and/or different density inlets 116 can be used to provide for an increasing effective intake area of inlets 116 in a direction away from the outlet 124. For example, both the size and density of inlets 116 can increase in a direction away from the outlet 124. Although counter-intuitive, smaller size inlets 116 can be provided in a direction away from the outlet 124; however, the smaller size inlets 116 would be balanced by having a greater density of inlets 116 to provide for the increased effective intake area of the inlets 116 in a direction away from the outlet 124. The alternative holds true in that a greater size area of inlets 116 would be needed to balance out a smaller density of inlets 116 in a direction away from the outlet 124.

Figure 8:
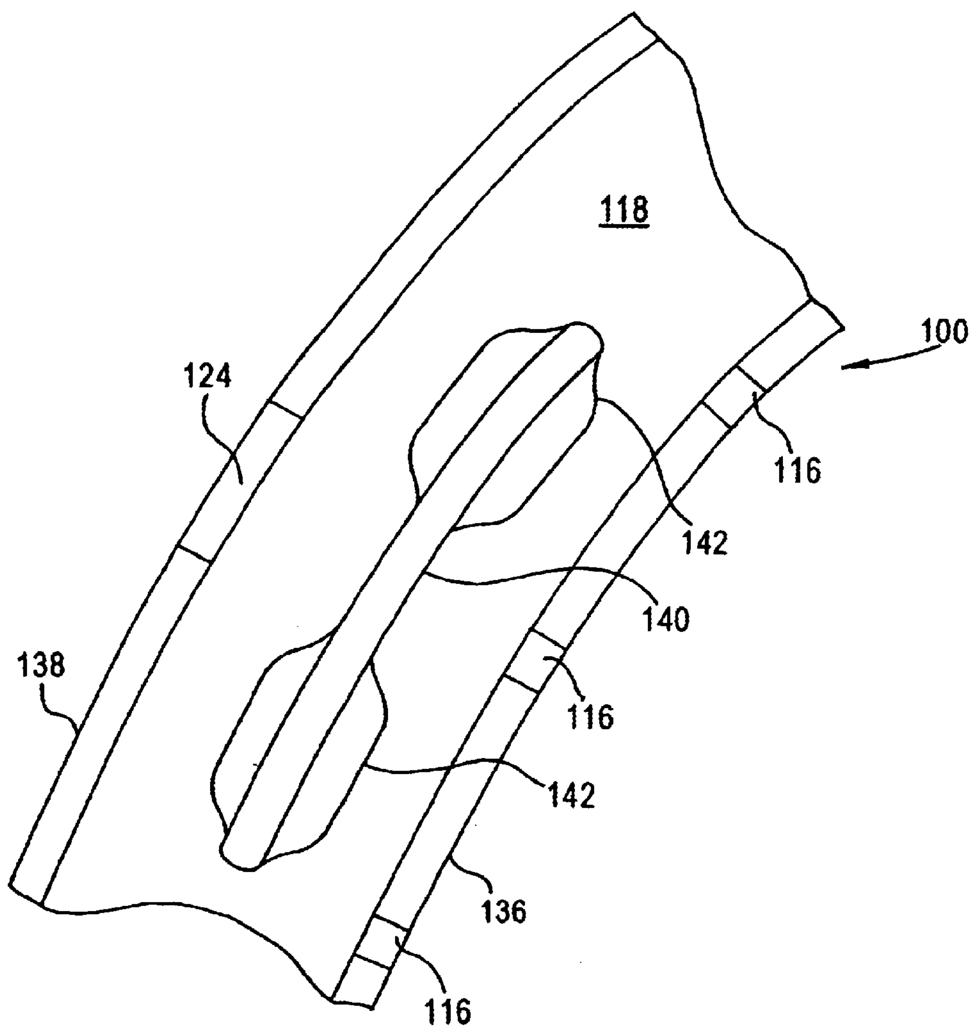
FIG. 8 is a partial plan view of the gas collector shown in FIG. 5 with a baffle disposed in a conduit and approximate to an outlet.
Figure 9:
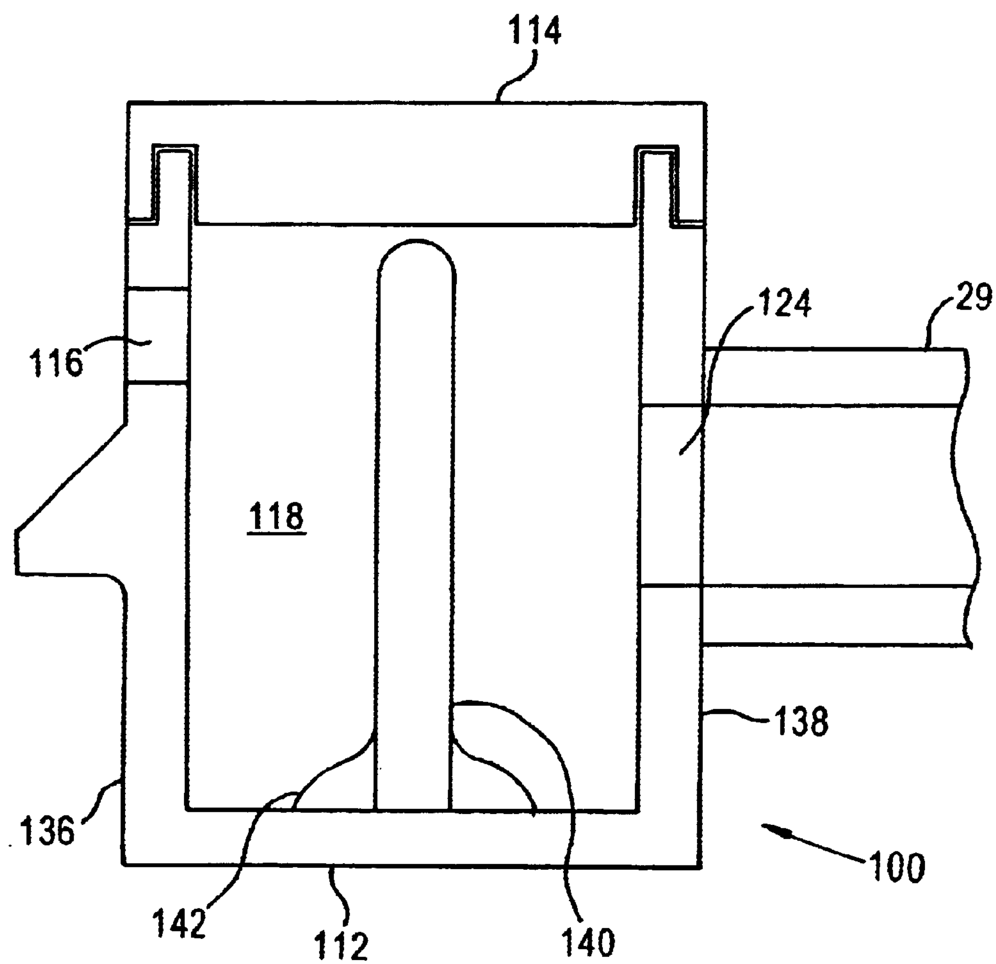
FIG. 9 is a cross section of the gas collector with a baffle disposed in the conduit and approximate to an outlet.

In an alternative aspect of the invention, as illustrated in FIGS. 8 and 9, an even flow of reaction gasses through the reaction chamber is obtained by disposing a baffle 140 within the reactor to impede the direct path of reaction gasses to an outlet 124, and any baffle 140 so capable is acceptable for use with the invention. Although the baffle 140 is not limited as to a particular location within the reactor. For example, the baffle can be located in the reaction chamber and in front of the inlets 116. However, in one aspect of the invention, the baffle 140 is located within the conduit 118 of the reaction chamber, such that the baffle 140 impedes the direct path of reaction gasses to an outlet 124 in an outer wall 138 from inlets 116 adjacent the outlet 124. The baffle 140 illustrated in FIGS. 8 and 9 is solid; however, the baffle 140 is not limited in this manner. For example, the baffle 140 can include slots or pathways through the baffle 140 through which the reactions gasses can pass.

As illustrated in FIG. 9, the baffle 140 extends from the first member 110 such that the distal end of the baffle 140 is approximate the second member 112. However, the baffle 140 is not limited as to the height of the baffle 140 within the conduit 118. For example, the height of the baffle 140 can be tapered such that the height of the baffle 140 within the conduit 118 is reduced at distances further away from the outlet 124. Furthermore, the baffle 140 is not limited as to the circumferential length of the baffle 140 within the conduit 118. For example, in one aspect, as illustrated in FIG. 8, the baffle 140 extends longitudinally to approximately the width of three adjacent inlets 116. In another aspect, the baffle 140 extends longitudinally to approximately the width of five adjacent inlets 116. Still further, for example, the baffle 140 can completely encircle the inner wall 136 of the gas collector 100. In this manner, the baffle 140 could include the slots or pathways, as previously discussed, to vary the flow of the reaction gasses through the conduit 118 and into the outlets 124.

The baffle 140 is not limited as to how the baffle 140 is connected to the gas collector 100. In a current aspect of the invention, however, the baffle 140 is formed during the machining of the conduit 118 such that the baffle 140 is integral with the first member 110. Alternatively, the baffle 140 can be attached to the gas collector via, for example, screws (not shown) through feet 142 on the baffle 140. In so doing, the baffle 140 can advantageously be inserted into a new gas collector 100 or retrofitted into an old gas collector in which the inlets 116 are regularly spaced along the gas collector 100.

Although not limited in this manner, at least one of the members 112, 114 of the body 110 can be rigid. A member 112, 114 that is rigid advantageously reduces flexing of the body 110, which can cause variations in the gas flow pattern in the reaction chamber and can also cause the leakage of gas from within the reaction chamber. Also, having a rigid member 112, 114 allows for closer control of dimensional tolerances, which allows for a tighter fit between the gas collector 100 and the reactor. The tighter fit between the gas collector 100 and the reactor also reduces the leakage of gasses from within the reaction chamber. Also, because the leakage of gasses from within the reaction chamber through other orifices other than the inlets 116 can disadvantageously modify the flow of gasses through the reaction chamber, the tighter fit between the gas collector 100 and the reactor can advantageously aid in providing an even flow of gasses through the reaction chamber. In a current aspect of the gas collector 100, the body 100 and, therefore, both the first and second members 112, 114 are rigid.

The members 112, 114 of the body 110 can be formed from any material capable of withstanding, without degradation, the process conditions resulting from use of the reactor. For example, when depositing GaAs, the temperature within the reaction chamber of the reactor reaches about 700° C., and the temperature at the gas collector reaches around 600–650° C. The temperature for other processes reach as high as about 1200° C. within the reaction chamber, although even higher temperatures are possible. An illustrative example of a material capable of withstanding the process conditions is Inconel, produced by Inco Alloys International.

Although not limited in this manner, the members 112, 114 of the body 110 can also be formed from a material that does not produce contaminants, such as outgassing, at the aforementioned temperatures. Contaminants can disadvantageously introduce additional reactants or particles into the reaction chamber that may interfere with the deposition process. An example of a material that does not produce contaminants is a high purity material, such as titanium.

Again, although not limited in this manner, the members 112, 114 of the body 110 can be formed from a material onto which the deposition material better adheres. In so doing, the extent of deposition material flaking off the gas collector 100 can be reduced because of the better adherence of the deposition material. As is known by those skilled in the art, examples of material properties that affect adherence include surface texture and porosity. An illustrative example of a material that provides good adherence for deposition materials is graphite.

In a current aspect of the invention, at least one of the members 112, 114 of the body 110 is formed from graphite. Graphite advantageously remains stable at high temperatures and does not outgas any contaminants or particles. Furthermore, reaction materials such as GaAs readily adhere to graphite, and graphite is a rigid material that resists flexing. As such, the use of graphite to form the members 112, 114 is particularly advantageous in preventing flaking of the reaction material deposited on the members 112, 114. In addition, graphite has good machinability, which allows for a closer control of dimensional tolerances. Furthermore, because graphite is substantially rigid, the body 110 will also be rigid, and as previously discussed, a rigid body 110 promotes a more consistent flow of reaction gasses through the reaction chamber.

The body 110 being made from a machinable material, such as graphite, also allows the portion of the body 110 adjacent the reaction chamber to be substantially circular. In contrast, the gas collector of the prior art is formed from multiple polygons; and therefore, portion adjacent the reaction chamber is not substantially circular. By forming the portion of the gas body 110 adjacent the reaction chamber to be substantially circular, the radial flow of reaction gasses into the gas collector 100 is more consistent.

Figure 10:
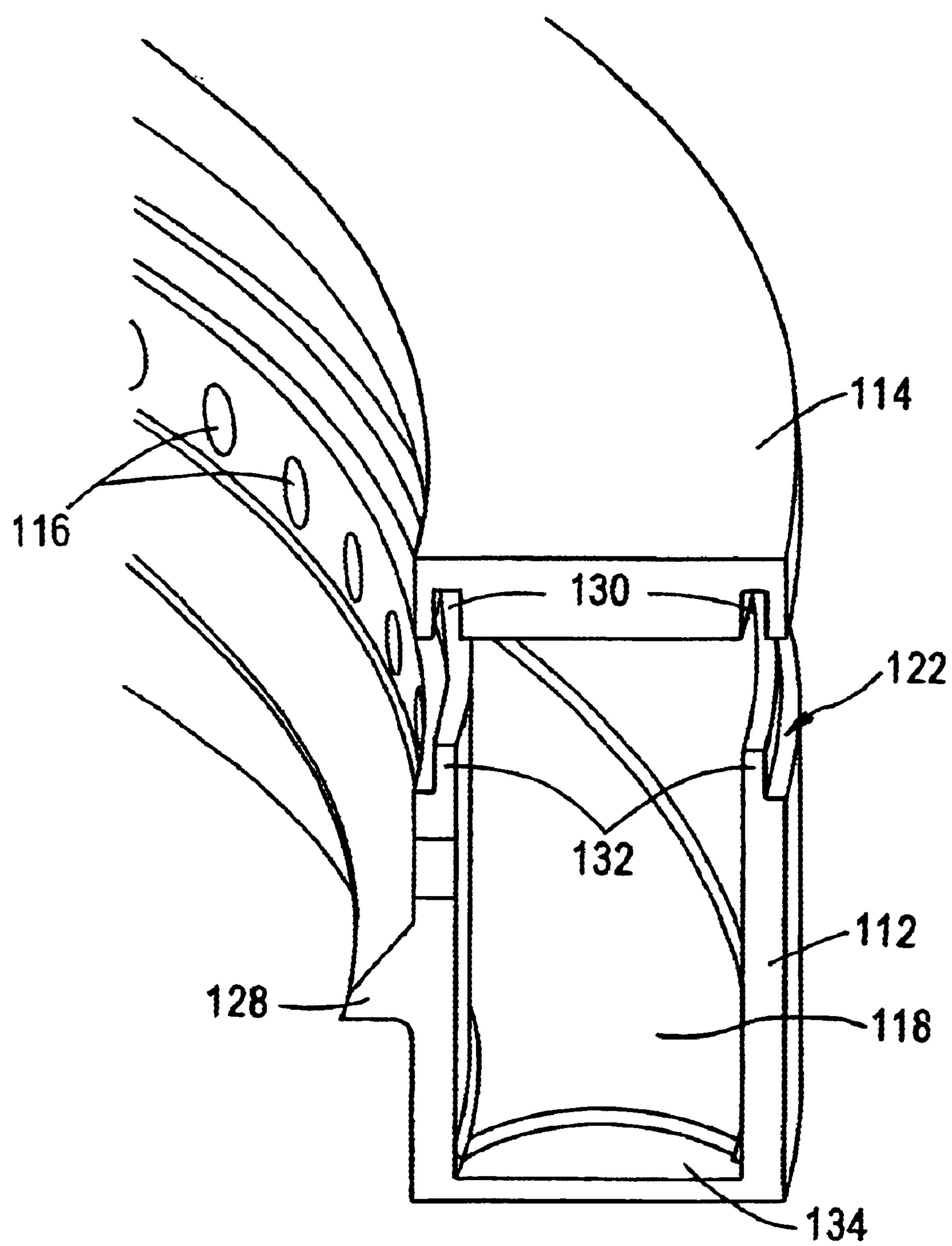
FIG. 10 is a perspective cross-sectional view of the gas collector.
Figure 11:
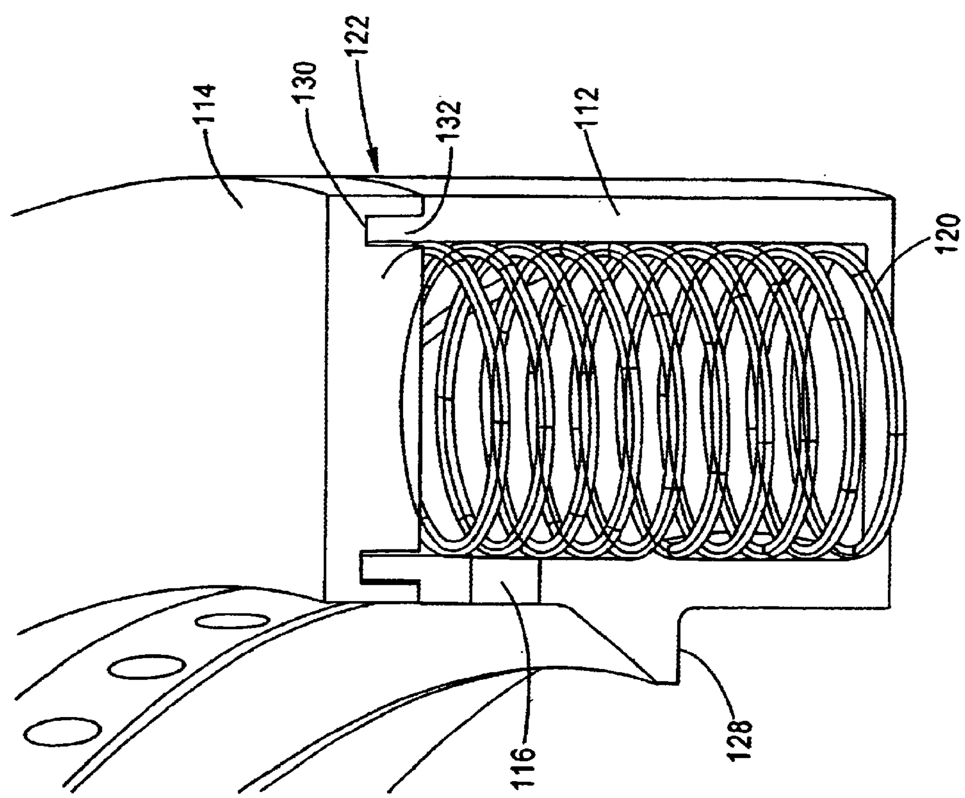
FIG. 11 is a perspective cross-sectional view of the gas collector with a spring positioned within the conduit of the gas collector.

As illustrated in FIGS. 10 and 11, the second member 114 is movable with respect to the first member 112. Additionally, inter-member seals 122 can be provided between the first and second members 112, 114. The inter-member seals 122 allow movement of the first and second members 112, 114 relative to one another and reduce the escape of reaction gasses from the conduit 118 through an interface between the first and second members 112, 114, and any inter-member seals 122 so capable are acceptable for use with the invention. In a current aspect, an inter-member seal 122 includes a female portion 130 and a male portion 132 interengaging with one another. The female portion 130 is positioned on either the first member 112 or the second member 114 and the male portion 132 is positioned on the opposite member, which is respectively the second member 114 or the first member 112.

The gas collector 100 can additionally include one or more devices for pressing the second member 114 against the lid to form a seal between the gas collector 100 and the lid, and any device so capable is acceptable for use with the gas collector 100. Additionally, the devices can be arranged such that an evenly distributed force is exerted against the second member 114 to form a seal between the gas collector 100 and the lid. For example, a piston contacting both the first and second members 112, 114 can be positioned within the conduit 118. Upon activation, the piston can press the second member 114 against the lid to form the seal between the gas collector 100 and the lid.

In a current aspect, the device for pressing the second member 114 against the lid is resilient such that the device resists the force of the lid pressing against the second member 114. For example, the spring-like device can consist of one or more springs 120 that contact both the first member 112 and the second member 114. Although not limited in this manner, the springs 120 are positioned within the conduit 118. Additionally, the springs 120 can be open and advantageously permit the passage of vapors through the coils of the spring 120. In so doing, locating the springs 120 within the conduit 118 only minimally interferes with the passage of reaction gasses through the conduit 118. This allows for a greater number of springs 120 to be positioned within the conduit 118 without requiring an outlet 124 between each pair of springs 120.

When the springs 120 are positioned within the conduit 118, the first and/or second members 112, 114 can include seats 134 associated with the springs 120. The seats 134 act to prevent lateral movement of each spring 120 within the conduit 118, and any seat 134 so capable is acceptable for use with the gas collector 100. In a current aspect, the seats 134 are in the form of a recess or counter-sunk hole within the first member 112. Additionally, the diameter of the springs 120 can be slightly less than the width of the conduit 118. In this manner, lateral movement of the springs 120 in a radial direction of the gas collector 100 can be prevented by the sidewalls of the conduit 120.

Although not limited in this manner, in a current aspect of the gas collector 100, the inlets 116 are positioned on a member 112 that is stationary relative to the reaction chamber of the reactor. As illustrated, a first member 112 includes inlets 116, and the first member 112 rests on a surface 200 within the reaction chamber (best shown in FIG. 12) and is therefore stationary relative to the reaction chamber. In so doing, the positional relationship of the inlets 116 in the first member 112 to the reaction chamber does not change. As such, by positioning inlets 116 on a member 112 that is stationary relative to the reaction chamber, the flow pattern of gasses through the reaction chamber does not vary one batch process to the next and/or from one gas collector to the next. In contrast, positioning inlets on a member that is movable relative to the reaction chamber, such as in the gas collector of the prior art, can result in the flow characteristics of gasses through the reaction chamber to vary between gas collectors and vary between processing batches.

Figure 12A:
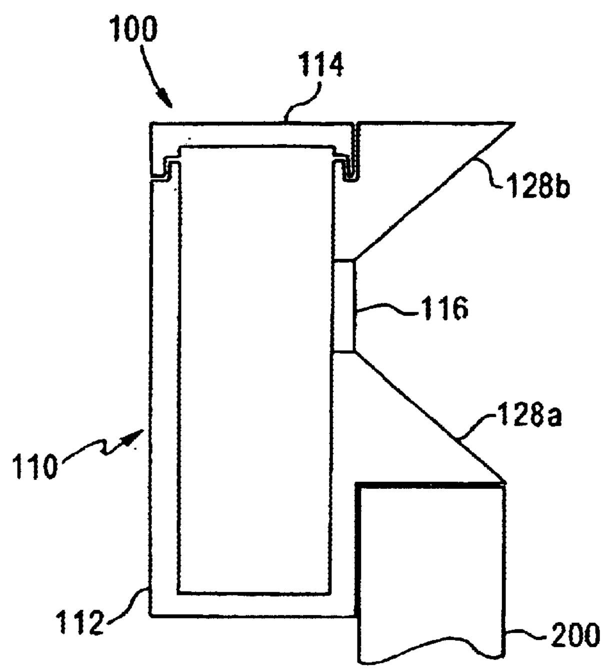
FIGS. 12A and 12B are alternative cross-sectional views of the gas collector.
Figure 12B:
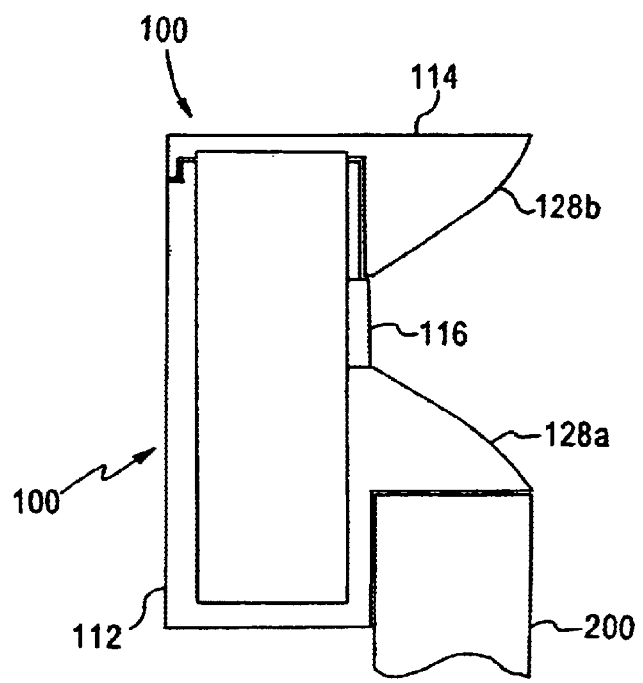

As illustrated in FIGS. 10 and 11, the body 110 can include one lip 128 extending from the body 110 adjacent the inlets 116, or as illustrated in FIGS. 12A and 12B, the body 110 can include two lips 128*a*, 128*b* that extend from the body 110 and are adjacent to the inlets 116. In a current aspect, the lip 128 slopes horizontally inward towards the reaction chamber and vertically away from the inlet 116. In this manner, one or more lips 128 can shape the flow of gasses into the inlets 116 of the gas collector 100.

The invention is not limited as to a particular profile of the lip 128. For example, as illustrated in the FIG. 12A, the lip 128*a*, 128*b* includes a portion having a straight profile that extends towards the reaction chamber and away from the inlet 116. However, the lip 128 can include a curved profile or both a curved profile and a straight profile, as illustrated in FIG. 12B. If curved, the profile can either be convex, as illustrated in FIG. 9B, or concave.

Each lip 128 can be positioned on either a member 114 of the body 110 movable relative to the inlets 116 or a member 112 of the body 110 stationary relative to the inlets 116. For example, as shown in FIG. 12A, the lip 128 is positioned on a member 112 that is stationary relative to the inlets 116. In this manner, the positional relationship between the lip 128 and the inlets 116 is constant; and therefore, the flow of gasses into inlets 116 resulting from the lip 128 will advantageously be consistent. Alternatively, as shown in FIG. 12B, the lip 128*b* can be positioned on a member 114 that is movable relative to the inlets 116.

By providing an even flow through the reaction chamber, the gas collector of the present invention which increases the quality and consistency of the material being deposited within the reaction chamber. These results can be obtained by providing a baffle within the conduit or increasing the size/density of inlet holes in a circumferential direction away from an outlet.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only an exemplary aspect of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A gas collector for collecting gasses from within a reaction chamber of a reactor, the reactor including a removable lid for enclosing the reaction chamber, comprising:

a rigid body defining a conduit within said body, at least one inlet, and at least one outlet;

a seal disposed on said body for cooperating with the lid to prevent escape of the gasses from the reaction chamber; and means for providing an even flow of gasses through the reaction chamber, wherein said at least one inlet directs the gasses from the reaction chamber into said conduit and said at least one outlet exhausts the gasses from said conduit.

2. The gas collector according to claim 1, wherein said means for providing an even flow include at least one baffle.

3. The gas collector according to claim 2, wherein said at least one baffle is positioned in said conduit.

4. The gas collector according to claim 2, wherein said at least one baffle is respectively positioned approximate each of said at least one outlet.

5. The gas collector according to claim 1, wherein said body includes equally-sized sectors including at least one of said inlets and said means for providing an even flow include having a total intake area of inlets in each of said sectors continually increase in a circumferential direction away from an outlet.

6. The gas collector according to claim 5, wherein a density of a number of inlets in each of said sectors increases for each of said sectors in a circumferential direction away from an outlet.

7. The gas collector according to claim 1, wherein said means for providing an even flow include increasing a size of each inlet in a circumferential direction away from an outlet.

8. The gas collector according to claim 1, wherein said body includes a first member and a second member, said seal disposed on said second member, and further comprising a resilient device for pressing said second member against the lid, said resilient device disposed within said conduit.

9. The gas collector according to claim 8, further comprising inter-member seals for reducing the flow of the gasses across an interface between said first member and said second member, said inter-member seals disposed between said first member and said second member and allowing movement of the first member relative to said second member.

10. The gas collector according to claim 1, wherein said body includes graphite.

11. A gas collector for collecting gasses from within a reaction chamber of a reactor, the reactor including a removable lid for enclosing the reaction chamber, comprising:

a rigid body defining a conduit within said body, at least one inlet, and at least one outlet;

a seal disposed on said body for cooperating with the lid to prevent escape of the gasses from the reaction chamber; and at least one baffle for providing an even flow of gasses through the reaction chamber, wherein said at least one inlet directs the gasses from the reaction chamber into said conduit and said at least one outlet exhausts the gasses from said conduit.

12. The gas collector according to claim 11, wherein said at least one baffle is positioned in said conduit. adjacent/approximate each of said at least one outlet.

13. The gas collector according to claim 11, wherein said at least one baffle is respectively positioned approximate each of said at least one outlet.

14. The gas collector according to claim 11, wherein each of said at least one baffle extend longitudinally to approximately the width of three adjacent inlets.

15. The gas collector according to claim 11, wherein a height of each of said at least one baffle taper is reduced at distances further away from the outlet.

16. The gas collector according to claim 11, wherein said body includes a first member and a second member, said seal disposed on said second member, and further comprising a resilient device for pressing said second member against the lid, said resilient device disposed within said conduit.

17. The gas collector according to claim 11, wherein said body includes graphite.

18. A gas collector for collecting gasses from within a reaction chamber of a reactor, the reactor including a removable lid for enclosing the reaction chamber, comprising:

a rigid body defining a conduit within said body, at least one inlet, and at least one outlet, said body including an inner wall divided into equally spaced sectors, each of said sectors including at least one of said inlets; and a seal disposed on said body for cooperating with the lid to prevent escape of the gasses from the reaction chamber, wherein said at least one inlet directs the gasses from the reaction chamber into said conduit and said at least one outlet exhausts the gasses from said conduit, and a total intake area of inlets in each of said sectors continually increases in a circumferential direction away from each of said at least outlets.

19. The gas collector according to claim 18, wherein a density of a number of inlets in each of said sectors increases for each of said sectors in a circumferential direction away from an outlet.

20. The gas collector according to claim 18, wherein a size of each said inlet continually increases in a circumferential direction away from an outlet.

21. The gas collector according to claim 18, wherein said body includes a first member and a second member, said seal disposed on said second member, and further comprising a resilient device for pressing said second member against the lid, said resilient device disposed within said conduit.

22. The gas collector according to claim 18, wherein said body includes graphite.

23. A reactor for forming deposits from gasses introduced into the reactor, comprising:

a reactor body defining a reaction chamber into which the gasses are introduced;

a removable lid for enclosing the reaction chamber;

at least one exhaust for removing the gasses from the reactor; and a gas collector for collecting gasses from within said reaction chamber, said gas collector including:

a rigid body defining at least one inlet, at least one outlet, and a conduit within said body of said gas collector, a seal disposed on said body of said gas collector for cooperating with said lid to prevent escape of the gasses from said reaction chamber, and means for providing an even flow of gasses through the reaction chamber, wherein said at least one inlet directs the gasses from said reaction chamber into said conduit and said at least one outlet exhausts the gasses from said conduit into said at least one exhaust.

24. The reactor according to claim 23, wherein said means for providing an even flow include at least one baffle respectively positioned in said conduit adjacent each of said at least one outlet.

25. The reactor according to claim 24, wherein said at least one baffle is positioned in said conduit. adjacent/approximate each of said at least one outlet.

26. The reactor according to claim 24, wherein said at least one baffle is respectively positioned approximate each of said at least one outlet.

27. The reactor according to claim 23, wherein said body of said gas collector includes equally-sized sectors including at least one of said inlets and said means for providing an even flow include having a total intake area of inlets in each of said sectors continually increase in a circumferential direction away from an outlet.

28. The reactor according to claim 27, wherein a density of a number of inlets in each of said sectors increases for each of said sectors in a circumferential direction away from an outlet.

29. The reactor according to claim 23, wherein said means for providing an even flow include increasing a size of each inlet in a circumferential direction away from an outlet.

30. The reactor according to claim 23, wherein said body of said gas collector includes a first member and a second member, said seal disposed on said second member, and further comprising a resilient device for pressing said second member against the lid, said resilient device disposed within said conduit.

31. The reactor according to claim 30, further comprising inter-member seals for reducing the flow of the gasses across an interface between said first member and said second member, said inter-member seals disposed between said first member and said second member and allowing movement of the first member relative to said second member.

32. The reactor according to claim 23, wherein said body of said gas collector includes graphite.

33. The reactor according to claim 23, wherein said reactor is an epitaxial reactor.

34. A reactor for forming deposits from gasses introduced into the reactor, comprising:

a reactor body defining a reaction chamber into which the gasses are introduced;

a removable lid for enclosing the reaction chamber;

at least one exhaust for removing the gasses from the reactor; and a gas collector for collecting gasses from within said reaction chamber, said gas collector including:

a rigid body defining a conduit within said body, at least one inlet, and at least one outlet, and a seal disposed on said body for cooperating with the lid to prevent escape of the gasses from the reaction chamber;

at least one baffle respectively positioned for providing an even flow of gasses through, the reaction chamber, wherein said at least one inlet directs the gasses from said reaction chamber into said conduit and said at least one outlet exhausts the gasses from said conduit into said at least one exhaust.

35. The reactor according to claim 34, wherein said at least one baffle is positioned in said conduit. adjacent/approximate each of said at least one outlet.

36. The reactor according to claim 34, wherein said at least one baffle is respectively positioned approximate each of said at least one outlet.

37. The reactor according to claim 34, wherein each of said at least one baffle extend longitudinally to approximately the width of three adjacent inlets.

38. The reactor according to claim 34, wherein a height of each of said at least one baffle taper is reduced at distances further away from the outlet.

39. The reactor according to claim 34, wherein said body of said gas collector includes a first member and a second member, said seal disposed on said second member, and further comprising a resilient device for pressing said second member against the lid, said resilient device disposed within said conduit.

40. The reactor according to claim 34, wherein said body of said gas collector includes graphite.

41. The reactor according to claim 34, wherein said reactor is an epitaxial reactor.

42. A reactor for forming deposits from gasses introduced into the reactor, comprising:

a reactor body defining a reaction chamber into which the gasses are introduced;

a removable lid for enclosing the reaction chamber;

at least one exhaust for removing the gasses from the reactor; and a gas collector for collecting gasses from within said reaction chamber, said gas collector including:

a rigid body defining a conduit within said body, at least one inlet, and at least one outlet, said body including an inner wall divided into equally spaced sectors, each of said sectors including at least one of said inlets; and a seal disposed on said body for cooperating with the lid to prevent escape of the gasses from the reaction chamber, wherein said at least one inlet directs the gasses from the reaction chamber into said conduit and said at least one outlet exhausts the gasses from said conduit, and a total intake area of inlets in each of said sectors continually increases in a circumferential direction away from each of said at least outlets.

43. The reactor according to claim 42, wherein a density of a number of inlets in each of said sectors increases for each of said sectors in a circumferential direction away from an outlet.

44. The reactor according to claim 42, wherein a size of each said inlet continually increases in a circumferential direction away from an outlet.

45. The reactor according to claim 42, wherein said body of said gas collector includes a first member and a second member, said seal disposed on said second member, and further comprising a resilient device for pressing said second member against the lid, said resilient device disposed within said conduit.

46. The reactor according to claim 42, wherein said body of said gas collector includes graphite.

47. The reactor according to claim 42, wherein said reactor is an epitaxial reactor.

* * * * *